US011043387B2

(12) United States Patent
Ramaswamy et al.

(10) Patent No.: US 11,043,387 B2
(45) Date of Patent: Jun. 22, 2021

(54) METHODS AND APPARATUS FOR PROCESSING A SUBSTRATE

(71) Applicant: APPLIED MATERIALS, INC., Santa Clara, CA (US)

(72) Inventors: Kartik Ramaswamy, San Jose, CA (US); Yang Yang, Cupertino, CA (US); Kenneth Collins, San Jose, CA (US); Steven Lane, Porterville, CA (US); Gonzalo Monroy, Santa Clara, CA (US); Yue Guo, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/668,107

(22) Filed: Oct. 30, 2019

(65) Prior Publication Data
US 2021/0134599 A1 May 6, 2021

(51) Int. Cl.
*H01L 21/3065* (2006.01)
*H01J 37/305* (2006.01)
*H01J 37/32* (2006.01)
*H01L 21/67* (2006.01)

(52) U.S. Cl.
CPC ...... *H01L 21/3065* (2013.01); *H01J 37/3053* (2013.01); *H01J 37/3255* (2013.01); *H01J 37/32137* (2013.01); *H01J 37/32568* (2013.01); *H01L 21/67069* (2013.01); *H01J 37/32091* (2013.01); *H01J 37/32119* (2013.01); *H01J 37/32183* (2013.01); *H01J 2237/002* (2013.01); *H01J 2237/3174* (2013.01); *H01J 2237/3341* (2013.01)

(58) Field of Classification Search
None
See application file for complete search history.

(56) References Cited

U.S. PATENT DOCUMENTS

| 5,770,023 A | 6/1998 | Sellers |
| 6,051,114 A | 4/2000 | Yao et al. |
| 6,187,685 B1 | 2/2001 | Hopkins et al. |
| 6,201,208 B1 | 3/2001 | Wendt et al. |

(Continued)

FOREIGN PATENT DOCUMENTS

JP 2010-177626 A 8/2010

OTHER PUBLICATIONS

International Search Report and Written Opinion for PCT/US2020/054784 dated Jan. 29, 2021.

*Primary Examiner* — Roberts P Culbert
(74) *Attorney, Agent, or Firm* — Moser Taboada

(57) ABSTRACT

Methods and apparatus for processing a substrate are provided herein. For example, a method for processing a substrate includes applying at least one of low frequency RF power or DC power to an upper electrode formed from a high secondary electron emission coefficient material disposed adjacent to a process volume; generating a plasma comprising ions in the process volume; bombarding the upper electrode with the ions to cause the upper electrode to emit electrons and form an electron beam; and applying a bias power comprising at least one of low frequency RF power or high frequency RF power to a lower electrode disposed in the process volume to accelerate electrons of the electron beam toward the lower electrode.

11 Claims, 2 Drawing Sheets

(56) References Cited

U.S. PATENT DOCUMENTS

| | | |
|---|---|---|
| 6,253,704 B1 | 7/2001 | Savas |
| 7,126,808 B2 | 10/2006 | Koo et al. |
| 7,718,538 B2 | 5/2010 | Kim et al. |
| 7,888,240 B2 | 2/2011 | Hamamjy et al. |
| 8,382,999 B2 | 2/2013 | Agarwal et al. |
| 8,383,001 B2 | 2/2013 | Mochiki et al. |
| 8,603,293 B2 | 12/2013 | Koshiishi et al. |
| 8,828,883 B2 | 9/2014 | Rueger |
| 8,916,056 B2 | 12/2014 | Koo et al. |
| 8,926,850 B2 | 1/2015 | Singh et al. |
| 9,039,871 B2 | 5/2015 | Nauman et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,129,776 B2 | 9/2015 | Finley et al. |
| 9,150,960 B2 | 10/2015 | Nauman et al. |
| 9,208,992 B2 | 12/2015 | Brouk et al. |
| 9,210,790 B2 | 12/2015 | Hoffman et al. |
| 9,224,579 B2 | 12/2015 | Finley et al. |
| 9,226,380 B2 | 12/2015 | Finley |
| 9,287,086 B2 | 3/2016 | Brouk et al. |
| 9,287,092 B2 | 3/2016 | Brouk et al. |
| 9,287,098 B2 | 3/2016 | Finley |
| 9,309,594 B2 | 4/2016 | Hoffman et al. |
| 9,362,089 B2 | 6/2016 | Brouk et al. |
| 9,435,029 B2 | 9/2016 | Brouk et al. |
| 9,483,066 B2 | 11/2016 | Finley |
| 9,490,107 B2 | 11/2016 | Kim et al. |
| 9,520,269 B2 | 12/2016 | Finley et al. |
| 9,558,917 B2 | 1/2017 | Finley et al. |
| 9,620,340 B2 | 4/2017 | Finley |
| 9,651,957 B1 | 5/2017 | Finley |
| 9,685,297 B2 | 6/2017 | Carter et al. |
| 9,767,988 B2 | 9/2017 | Brouk et al. |
| 10,312,048 B2 | 6/2019 | Dorf et al. |
| 2002/0139658 A1* | 10/2002 | Kanakasabapathy ......... H01J 37/32422 204/164 |
| 2003/0132198 A1* | 7/2003 | Ono ......... H01L 21/32137 216/69 |
| 2006/0037701 A1* | 2/2006 | Koshiishi ......... H01L 21/31116 156/345.44 |
| 2007/0113981 A1 | 5/2007 | Brcka |
| 2008/0023440 A1* | 1/2008 | Chen ......... B05D 3/145 216/58 |
| 2008/0135401 A1 | 6/2008 | Kadlec et al. |
| 2008/0289576 A1 | 11/2008 | Lee et al. |
| 2010/0072172 A1 | 3/2010 | Hayashi et al. |
| 2010/0273332 A1 | 10/2010 | Edelberg |
| 2011/0281438 A1 | 11/2011 | Lee et al. |
| 2012/0000421 A1 | 1/2012 | Miller et al. |
| 2012/0088371 A1 | 4/2012 | Ranjan et al. |
| 2014/0154819 A1 | 6/2014 | Gaff et al. |
| 2014/0262755 A1 | 9/2014 | Deshmukh et al. |
| 2014/0263182 A1 | 9/2014 | Chen et al. |
| 2016/0020072 A1 | 1/2016 | Brouk et al. |
| 2016/0314946 A1 | 10/2016 | Pelleymounter |
| 2017/0011887 A1 | 1/2017 | Deshmukh et al. |
| 2017/0022604 A1 | 1/2017 | Christie et al. |
| 2017/0358431 A1 | 12/2017 | Dorf et al. |
| 2018/0226225 A1 | 8/2018 | Koh et al. |
| 2019/0088518 A1 | 3/2019 | Koh et al. |
| 2019/0088519 A1 | 3/2019 | Cho et al. |
| 2019/0088520 A1 | 3/2019 | Kraus et al. |
| 2019/0088521 A1 | 3/2019 | Chua et al. |
| 2019/0088522 A1 | 3/2019 | Lindley et al. |
| 2019/0090338 A1 | 3/2019 | Koh et al. |
| 2019/0221437 A1 | 7/2019 | Yang et al. |

\* cited by examiner

METHODS AND APPARATUS FOR PROCESSING A SUBSTRATE

FIELD

Embodiments of the present disclosure generally relate to methods and apparatus for processing a substrate, and more particularly, to methods and apparatus configured for electron beam reactive plasma etching of a substrate.

BACKGROUND

In accordance with current substrate (e.g., wafer) manufacture, etch speed, etch profile, and etch selectivity can be controlled to lower manufacturing cost and increase circuit element density on a substrate. Etch features (e.g., memory holes, slits, etc.) on a substrate, however, continue to shrink in size or increase in aspect ratio (e.g., ratio of depth to width of a feature). For example, in three dimensional (3D) NAND device manufacture, substrates (wafers) can include up to 96 layers and can extend up to 128 layers. Additionally, an aspect ratio of a memory hole and/or slit, for example, can be between 100 to 200 with a memory hole depth ranging from about 6 µm to 8 µm, thus making memory hole etching one of the most critical and challenging steps in manufacture of 3D NAND devices. For example, such high aspect ratio (HAR) etching not only requires high etching speed and high etching selectivity, e.g., to mask material on a substrate, but HAR etching also requires a straight profile without bowing and twisting, no under-etch and minimum micro-loading, minimum aspect ratio dependent etching (ARDE), and uniformity across the entire substrate (e.g., critical dimension (CD) variation of $3\sigma<1\%$).

Likewise, for Finfet manufacture targeted for logic applications, there is often a requirement to chemically etch similar materials with a selectivity ratio greater than 20, e.g., etch between silicon oxide and silicon nitride).

Thus, the inventors have provided improved methods and apparatus configured for electron beam reactive plasma etching of a substrate.

SUMMARY

Methods and apparatus for electron beam reactive plasma etching of a substrate are provided herein. In some embodiments, a method includes applying at least one of low frequency RF power or DC power to an upper electrode formed from a high secondary electron emission coefficient material disposed adjacent to a process volume; generating a plasma comprising ions in the process volume; bombarding the upper electrode with the ions to cause the upper electrode to emit electrons and form an electron beam; and applying a bias power comprising at least one of low frequency RF power or high frequency RF power to a lower electrode disposed in the process volume to accelerate electrons of the electron beam toward the lower electrode.

In accordance with one or more embodiments, an apparatus for processing a substrate includes a controller configured to: apply at least one of low frequency RF power or DC power to an upper electrode formed from a high secondary electron emission coefficient material disposed adjacent to a process volume; generate a plasma comprising ions in the process volume; and bombarding the upper electrode with the ions to cause the upper electrode to emit electrons and form an electron beam; and apply a bias power comprising at least one of low frequency RF power or high frequency RF power to a lower electrode disposed in the process volume to accelerate electrons of the electron beam toward the lower electrode.

In accordance with one or more embodiments, a nontransitory computer readable storage medium having stored thereon instructions that when executed by a processor configure the processor to perform a method for processing a substrate. The method includes applying at least one of low frequency RF power or DC power to an upper electrode formed from a high secondary electron emission coefficient material disposed adjacent to a process volume; generating a plasma comprising ions in the process volume; bombarding the upper electrode with the ions to cause the upper electrode to emit electrons and form an electron beam; and applying a bias power comprising at least one of low frequency RF power or high frequency RF power to a lower electrode disposed in the process volume to accelerate electrons of the electron beam toward the lower electrode.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
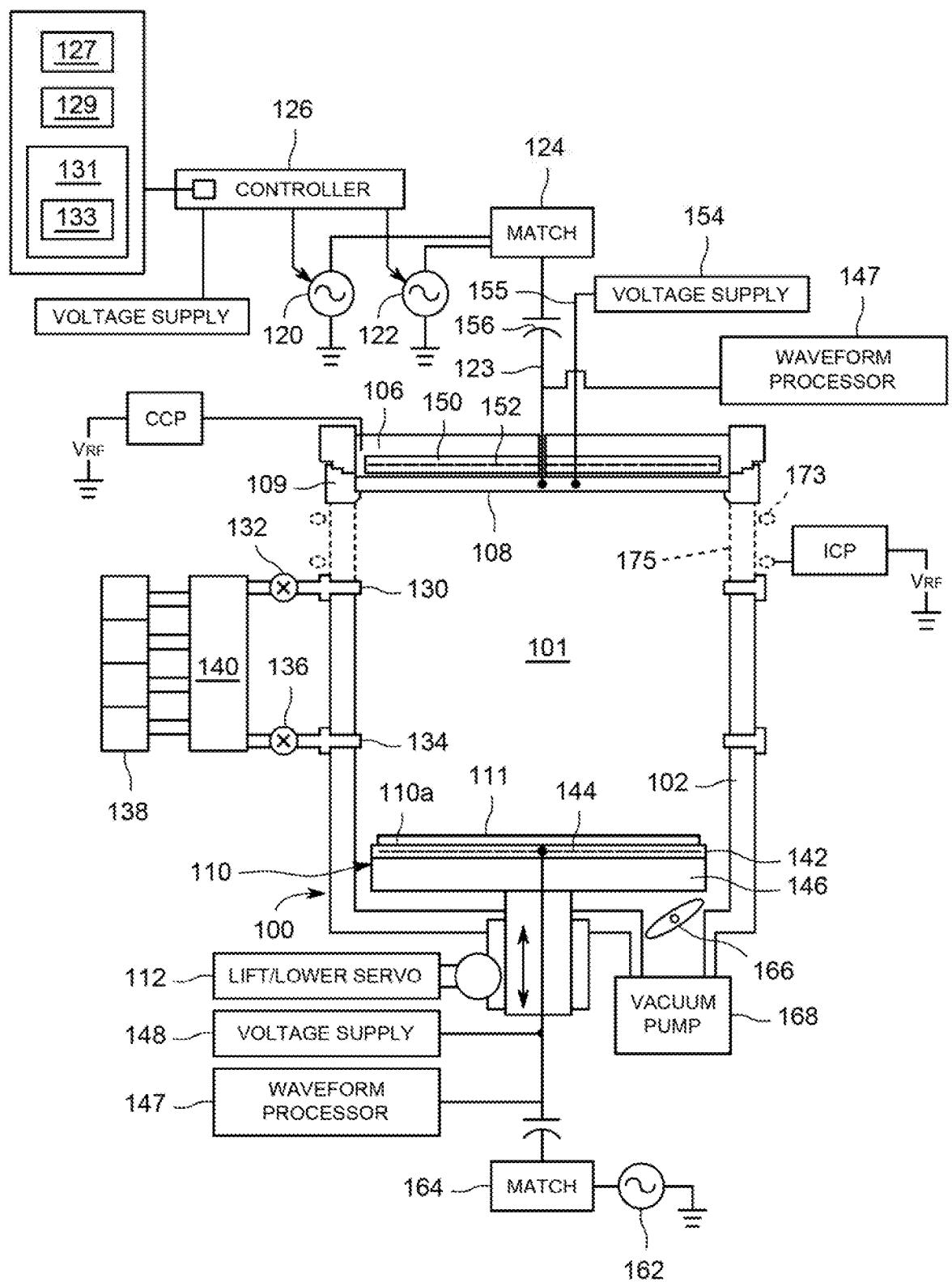
FIG. 1 is a schematic diagram of an apparatus, in accordance with one or more embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus configured for electron beam reactive plasma etching of a substrate are provided herein. More particularly, in accordance with the present disclosure, the inventors have found that when compared to conventional etching apparatus, e.g., reactive ion etching (RIE), etching apparatus described herein: a) provide, for the same level of incident ion energy used by conventional etching apparatus, increased etch rate, e.g., thirty percent increase in etch rate, b) provide increased source electron beam for increased etch rate without having to increase bias power, which conventional etching apparatus sometime need increase to compensate for a reduction in ion energy (e.g., caused by clogging), which can sometimes generate thermal load to a substrate (e.g., a wafer), c) eliminate micro-trenching, e.g., due to charging effect which causes faster etching to occur in corner of non-flat etch fronts, d) provide increased etch depth while minimizing ARDE effect, e.g., due to charging effect, and e) provide increased profile control, e.g., reduce, if not eliminate, bowing and/or twisting, due to charging effect at an upper portion of an etch feature.

FIG. 1 is a schematic diagram of an apparatus, in accordance with at one or more embodiments of the present disclosure. The apparatus is suitable for etching one or more substrates (wafers) using an electron beam (ebeam). Accordingly, in at least some embodiments, the apparatus is a process chamber 100 (e.g., an ebeam process chamber) that is configured to perform ebeam induced etching (EBIE). The process chamber 100 has a chamber body 102 which defines a process volume 101. In an embodiment, the chamber body 102 has a substantially cylindrical shape and may be fabricated from a material suitable for maintaining a vacuum pressure environment therein, such as metallic materials, for example aluminum or stainless steel.

A ceiling 106 is coupled to the chamber body 102 and forms the process volume 101. The ceiling 106 is formed from an electrically conductive material, such as the materials utilized to fabricate the chamber body 102. The ceiling 106 is coupled to and supports an electrode 108 (e.g., an upper electrode). In some embodiments, the electrode 108 is coupled to the ceiling 106 such that the electrode 108 is disposed adjacent or within the process volume 101. The electrode 108 is formed from a process-compatible material having a high secondary electron emission coefficient, e.g., a secondary electron emission coefficient, of about 5 to about 10. Materials having relatively high secondary emission coefficients can include, but are not limited to, silicon, carbon, silicon carbon materials, or silicon-oxide materials. Alternatively, the electrode 108 can be formed from a metal oxide material such as aluminum oxide ($Al_2O_3$), yttrium oxide ($Y2O_3$), or zirconium oxide (ZrO2). A dielectric ring 109, which is formed from an electrically insulating material, is coupled to the chamber body 102 and surrounds the electrode 108. As illustrated, the dielectric ring 109 is disposed between the chamber body 102 and the ceiling 106 and supports the electrode 108.

The ceiling 106 can include an insulating layer 150 containing a chucking electrode 152 facing the electrode 108. In at least some embodiments, a DC voltage power supply 154 can be coupled to the chucking electrode 152 via the feed conductor 155, for electrostatically clamping the electrode 108 to the ceiling 106, and to the electrode 108 for applying a DC power (e.g., a voltage potential) thereto. In such embodiments, a DC blocking capacitor 156 can be connected in series with the output of an impedance match circuit 124. A controller 126 functions to control the DC voltage power supply 154.

Mechanical contact between the electrode 108 and the ceiling 106 is sufficient to maintain high thermal conductance between the electrode 108 and the ceiling 106. Additionally, a force of the mechanical contact can be regulated by the electrostatic clamping force provided by the DC voltage power supply 154.

In one or more embodiments, the ceiling 106 is electrically conductive and in electrical contact with the electrode 108. Power from an impedance match circuit 124 is conducted through the ceiling 106 to the electrode 108. In one or more embodiments, the chamber body 102 can be maintained at ground potential. In one or more embodiments, grounded internal surfaces (i.e., chamber body 102) inside the process chamber 100 can be coated with a process compatible material such as silicon, carbon, silicon carbon materials, or silicon-oxide materials, aluminum oxide ($Al_2O_3$), yttrium oxide ($Y_2O_3$), or zirconium oxide ($ZrO_2$).

In some embodiments, internal passages (not shown) for conducting a thermally conductive liquid or media inside the ceiling 106 are connected to a thermal media circulation supply. The thermal media circulation supply acts as a heat sink or a heat source.

A pedestal 110 is disposed in the process volume 101. The pedestal 110 supports a substrate 111 (e.g., semiconductor wafers, such as silicon wafers, or glass panels or other substrates, such as for solar cell, display, or other applications) thereon and has a substrate support surface 110a oriented parallel to the electrode 108. In an embodiment, the pedestal 110 is movable in the axial direction by a lift servo 112. During operation, an upper electrode, such as the electrode 108, is maintained at one or more distances (e.g., a process position) from the substrate support surface 110a. For example, in at least some embodiments, the electrode 108 is maintained from a process position for processing a substrate at a distance from about 1 inch to about 20 inches. For example, in at least some embodiments, the distance can be about 6 inches to about 10 inches.

The controller 126 is provided and coupled to various components of the process chamber 100 to control the operation of the process chamber 100 for processing a substrate. The controller 126 includes a central processing unit (CPU) 127, support circuits 129 and a memory or non-transitory computer readable storage medium 131. The controller 126 is operably coupled to and controls one or more energy sources directly, or via computers (or controllers) associated with the process chamber 100 and/or support system components. The controller 126 may be any form of general-purpose computer processor that can be used in an industrial setting for controlling various chambers and sub-processors. The memory, or non-transitory computer readable storage medium, 131 of the controller 126 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 129 are coupled to the CPU 127 for supporting the CPU 127 in a conventional manner. The support circuits 129 include cache, power supplies, clock circuits, input/output circuitry and subsystems, and the like. Inventive methods as described herein, such as the method for processing a substrate (e.g., EBIE of a substrate), may be stored in the memory 131 as software routine 133 that may be executed or invoked to control the operation of the one or more energy sources in the manner described herein. The software routine 133 may also be stored and/or executed by a second CPU (not shown) that is remotely located from the hardware being controlled by the CPU 127.

In one or more embodiments, the pedestal 110 can include an insulating puck 142 which forms the substrate support surface 110a, a lower electrode 144 disposed inside the insulating puck 142, and a chucking voltage supply 148 connected to the electrode 144. Additionally, in at least some embodiments, a base layer 146 underlying the insulating puck 142 can include one or more internal passages (not shown) for circulating a thermal transfer medium (e.g., a liquid) from a circulation supply. In such embodiments, the circulation supply can function as a heat sink or as a heat source.

A high frequency RF power generator 120 having a frequency from about 20 MHz to about 200 MHz and a low frequency RF power generator 122 having a frequency from about 100 kHz to about 20 MHz are coupled to the electrode 108 through, for example, an impedance match circuit 124 via an RF feed conductor 123. In one or more embodiments, the RF feed conductor 123 from the impedance match circuit 124 can be connected to the electrode support or ceiling 106 rather than being directly connected to the electrode 108. In such embodiments, RF power from the RF feed conductor 123 can be capacitively coupled from the electrode support to the electrode 108. The impedance match circuit 124 is adapted to provide an impedance match at the different frequencies of the high frequency RF power generator 120 and the low frequency RF power generator 122, as well as filtering to isolate the high frequency RF power generator 120 and the low frequency RF power generator 122 from one another. Output power levels of the high frequency RF power generator 120 and the low frequency RF power generator 122 can be independently controlled by a controller 126, as will be described in greater detail below.

With the high frequency RF power generator 120 and the low frequency RF power generator 122, radial plasma uniformity in the process volume 101 can be controlled by selecting a distance (e.g., from about 6 inches to about 10 inches) between the electrode 108 and pedestal 110. For example, in some embodiments, a lower VHF frequency produces an edge-high radial distribution of plasma ion density in the process volume 101 and an upper VHF frequency produces a center-high radial distribution of plasma ion density. With such a selection, the power levels of the high frequency RF power generator 120 and the low frequency RF power generator 122 are capable of generating a plasma with a substantially uniform radial plasma ion density.

Upper gas injectors 130 provide process gas into the process volume 101 through a first valve 132, and lower gas injectors 134 provide process gas into the process volume 101 through a second valve 136. The upper gas injectors 130 and the lower gas injectors 134 can be disposed in sidewalls of the chamber body 102. Process gas is supplied from an array of process gas supplies such as gas supplies 138 through an array of valves 140 which are coupled to the first valve 132 and second valve 136. Process gas species and gas flow rates delivered into the process volume 101 can be independently controllable. For example, gas flow through the upper gas injectors 130 may be different from gas flow through the lower gas injectors 134. The controller 126 governs the array of valves 140.

In one embodiment, one or more inert gases, such as helium (He), argon (Ar) (or other inert gas), and/or one or more reactive gases, such as hydrogen ($H_2$), hydrogen bromide (HBr), ammonia ($NH_3$), disilane ($Si_2H_6$), methane ($CH_4$), acetylene ($C_2H_2$), nitrogen trifluoride ($NF_3$), tetrafluoromethane ($CF_4$), sulfur hexafluoride ($SF_6$), carbon monoxide (CO), carbonyl sulfide (COS), trifluoromethane ($CHF_3$), hexafluorobutadiene ($C_4F_6$), chlorine ($Cl_2$), nitrogen ($N_2$), oxygen ($O_2$), combinations thereof, and the like can be supplied into the process volume 101 through either or both the upper gas injectors 130 and the lower gas injectors 134. In some embodiments, the process gas delivered to the process volume 101 adjacent the electrode 108 can accelerate secondary electrons toward the substrate 111, as will be described in greater detail below, and/or buffer the electrode 108 from a reactive plasma formed in the process volume 101, thus increasing the useful life of the electrode 108.

In accordance with the present disclosure, plasma is generated in the process volume 101 by various bulk and surface processes, for example, by capacitive coupling 170 (e.g., capacitive coupling plasma (CCP)) and/or inductive coupling 172 (e.g., inductive coupling plasma (ICP)). Inductively coupled power or high frequency capacitively coupled power can be used to achieve independent control of plasma density, aside from bias power controlling ion energy. Accordingly, when the process chamber 100 is configured for use with the capacitive coupling 170 (e.g., configured as a CCP reactor), source power can refer to a higher frequency (compared to bias) power being applied to either a bias electrode (e.g., the electrode 144), which supports the substrate 111, or the upper electrode, e.g., the electrode 108. Alternatively or additionally, when the process chamber 100 is configured for use with the inductive coupling 172 (e.g., configured as an ICP reactor), the source power refers to power applied to a coil 173 (shown in phantom in FIG. 1). When the process chamber 100 is configured as an ICP reactor, a dielectric window 175 (also shown in phantom) is provided on a side of the chamber body 102 of the process chamber 100. The dielectric window 175 is configured to provide a vacuum boundary and a window for electromagnetic wave exciting plasma.

The inventors have found that ions generated by a CCP or ICP are influenced by an electric field that encourages ion bombardment of the electrode 108 by the ions generated from the plasma, as will be described in greater detail below. Moreover, depending on a mode of operation of the process chamber 100, ion bombardment energy of the electrode 108 can be a function of a power supplied to the electrode 108, e.g., provided by one or more of the DC voltage power supply 154, the low frequency RF power generator 122, or the high frequency RF power generator 120. For example, in at least some embodiments, ion bombardment energy of the electrode 108 can be provided by application of voltage from one or both the DC voltage power supply 154 and the low frequency RF power generator 122. In at least some embodiments, in addition to using one or both the DC voltage power supply 154 and the low frequency RF power generator 122, the high frequency RF power generator 120 can be used to increase plasma density and ebeam flux.

When the DC voltage power supply 154 is used to supply power (e.g., bias) to the electrode 108, the power supplied by the DC voltage power supply 154 can be about 1 W to about 30 kW (e.g., about −1560V to about −1440V). Similarly, when the low frequency RF power generator 122 is used to supply power (e.g., bias) to the electrode 108, the power supplied by the low frequency RF power generator 122 can be about 1 W to about 30 KW with a frequency from about 100 kHz and about 20 MHz. Likewise, when the high frequency RF power generator 120 is used in conjunction with either or both the DC voltage power supply 154 and the low frequency RF power generator 122, the power supplied by the high frequency RF power generator 120 can be about 1 W to about 10 kW with a frequency from about 20 MHz and about 200 MHz.

The ion bombardment energy of the electrode 108 and the plasma density can be functions of both the high frequency RF power generator 120 and the low frequency RF power generator 122 and the DC voltage power supply 154. For example, in at least some embodiments, the ion bombardment energy of the electrode 108 is substantially controlled by the lower frequency power from the low frequency RF power generator 122 (or the DC voltage power supply 154) and the plasma density in the process volume 101 can be substantially controlled (enhanced) by the power from the high frequency RF power generator 120. In at least some embodiments, ion bombardment of the electrode 108 causes the electrode 108 to emit secondary electrons. Energetic secondary electrons, which have a negative charge, are emitted from the interior surface of the electrode 108 and accelerated away from the electrode 108 due to the negative bias of the electrode 108, as will be described in greater detail below. Additionally, to increase ebeam bombardment dose at a substrate surface, a relative power provided by each of the low frequency RF power generator 122 and/or the DC voltage power supply 154 can be varied to vary a corresponding voltage provided at the electrode 108 and/or the electrode 144, as will be described in greater detail below.

An ebeam flux of energetic electrons from the emitting surface of the electrode 108 may be oriented substantially perpendicular to the interior surface of the electrode 108. A beam energy of the ebeam can be approximately equal to the ion bombardment energy of the electrode 108, which typically can range from about 100 eV to 20,000 eV. At least a portion of the ebeam, comprised of the secondary electron flux emitted from electrode 108 due to energetic ion bombardment of the electrode 108 surface, propagates through the process volume 101 and reacts with process gases near the substrate 111. With utilization of the one or more previously described process gases, such as Ar, the inventors have found that the effect of ebeam bombardment on the substrate 111 can used in a variety of ways. First, as noted above, the inventors have found that ebeam bombard on a reactive species adsorbed surface can induce etching reactions (e.g., EBIE), which provides damage free etch and high etch selectivity to a substrate.

Second, as an electric field on a surface of a substrate is always pointing towards the substrate, charging effects can negatively affect the processing of a substrate. More particularly, electrons can only approach a substrate during a moment of sheath (e.g., electrostatic sheath) collapse, e.g., at a positive peak of an RF cycle, for charge neutralization. Additionally, with increasing aspect ratio, less and less electrons from bulk plasma can reach a bottom of etching features. Therefore, positive charges can accumulate at the bottom of etching feature and build up an electric field that retards incoming ions. For example, based on empirical data, for a memory hole with aspect ratio of 50:1, more than fifty percent of ions cannot reach the bottom of the memory hole and there is a significant reduction in ion energy due to positive field retardation. The charging effect, together with neutral transportation limitation, can cause a slow-down in etch rate with increasing aspect ratio (e.g., ARDE effect). Furthermore, the charging effect can cause deflection of ion trajectory (e.g., ion bombardment on sidewall instead of vertically downwards), thus causing challenges in etch profile control such as bowing, twisting, under-etch and microtrenching. Accordingly, the inventors have found that ebeam bombard can be used to neutralize the positive ion charges accumulated at a bottom and/or a sidewall of etch features (e.g., memory holes), thus eliminating charging effects.

In some embodiments, an RF bias power generator 162 can be coupled through an impedance match 164 to an electrode 144 of the pedestal 110. The RF bias power generator 162, if used, is configured to accelerate ions onto the substrate 111. The RF bias power generator 162 can be configured to provide low frequency RF power and/or high frequency RF power. For example, in at least some embodiments, the RF bias power generator 162 can be configured to supply 1 W to 30 kW of power to the electrode 144 at one or more frequencies, e.g., of about 100 kHz to about 200 MHz. In some embodiments, for example, the RF bias power generator 162 can be configured to supply 1 W to 30 kW of power to the electrode 144 at a frequency of about 100 kHz to about 100 MHz.

A waveform tailoring processor 147 may be connected between an output of the impedance match 164 and the electrode 144 and/or an output of the impedance match circuit 124 and the electrode 108. The waveform tailoring processor 147 controller can be configured to change a waveform produced by the RF bias power generator 162 and/or the high frequency RF power generator 120 and the low frequency RF power generator 122 to a desired waveform. The ion energy of plasma near the substrate 111 and/or the electrode 108 can be controlled by the waveform tailoring processor 147. For example, in some embodiments, the waveform tailoring processor 247 produces a waveform in which an amplitude is held during a certain portion of each RF cycle at a level corresponding to a desired ion energy level. The controller 126 controls the waveform tailoring processor 147.

Etching of the substrate 111 can be also influenced by one or more factors. For example, pressure (in addition to ebeam energy, ebeam plasma power, and bias power if used) can influence etching of the substrate 111. Accordingly, in an embodiment, a pressure maintained in the process volume 101 during EBIE of the substrate 111 can be between about 0.1 mTorr to about 300 mTorr. For example, in at least some embodiments, such as when ebeam neutralization and etch profile control are necessary, a pressure maintained in the process volume 101 during EBIE of the substrate 111 can be between about 0.1 mTorr to about 30 mTorr. Likewise, in at least some embodiments, such as when ebeam neutralization and etch profile control are not necessary and bias power is not needed, a pressure maintained in the process volume 101 during EBIE of the substrate 111 can be between about 0.1 mTorr to about 100 mTorr. The pressure is generated by a vacuum pump 168 which is in fluid communication with the process volume 101. The pressure is regulated by a gate valve 166 which is disposed between the process volume 101 and the vacuum pump 168. The controller 126 controls the vacuum pump 168 and/or the gate valve 166.

Figure 2:
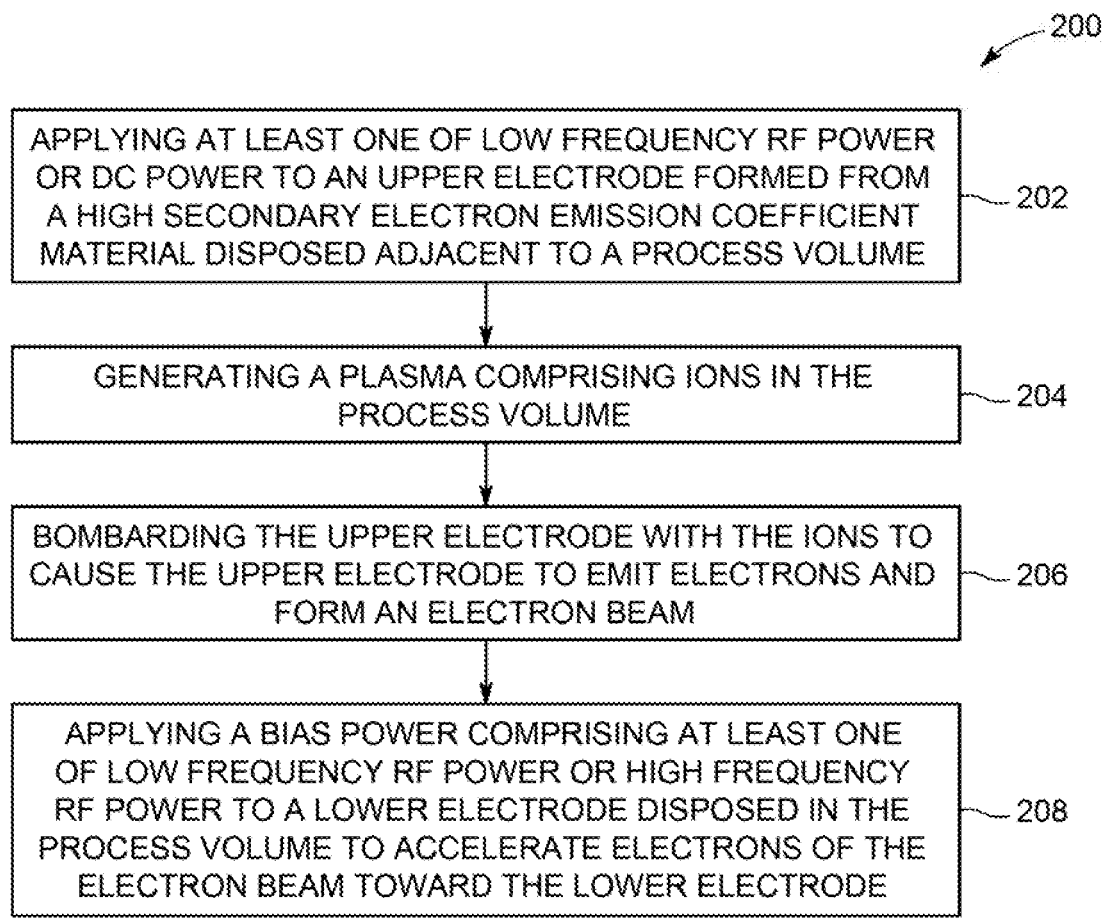
FIG. 2 is a flowchart of a method for processing a substrate, in accordance with one or more embodiments of the present disclosure.

FIG. 2 is a flowchart of a method 200 for processing a substrate, in accordance with one or more embodiments of the present disclosure. The method 200 can be performed using, for example, a process chamber that is configured for performing EBIE of a substrate, e.g., the process chamber 100. For illustrative purposes, the process chamber is assumed configured as a CCP reactor configured for EBIE of a substrate, e.g., the substrate 111, which can be, for example, a 150 mm, 200 mm, 300 mm, 450 mm substrate, etc. For example, in at least some embodiments, the substrate can be a 300 mm substrate, such as a semiconductor wafer or the like. As can be appreciated, the herein described power/voltages and/or pulsing/duty cycles can be scaled accordingly, e.g., for substrates having diameters greater or less than 300 mm. Initially, one or more of the above described process gases can be introduced into a process volume, e.g., the process volume 101, of the process chamber. For example, in at least some embodiments, the process gas can be one or more of He, Ar, and the like (or other inert gas), and/or $H_2$, HBr, $NH_3$, $Si_2H_6$, $CH_4$, $C_2H_2$, $NF_3$, $CF_4$, $SF_6$, CO, COS, $CHF_3$, $C_4F_6$, $Cl_2$, $N_2$, $O_2$, and the like (or other reactive gas). Additionally, the process volume can be maintained at one or more operating pressures from about 0.1 mTorr to about 300 mTorr. For example, in at least some embodiments, the pressure can be maintained at 0.1 mTorr to about 100 mTorr.

At 202, one or both of low frequency RF power and DC power can be applied to an upper electrode (e.g., the electrode 108), which, as noted above, can be formed from a high secondary electron emission coefficient material, disposed adjacent to the process volume. For example, in at least some embodiments, an RF power generator, e.g., the low frequency RF power generator 122, can be used to supply low frequency RF power to the upper electrode. As noted above, the low frequency RF power applied to the upper electrode can be about 1 W to about 30 KW and can be provided at a frequency of about 100 kHz to about 20 MHz.

Alternatively or additionally, at 202, DC power, e.g., using the DC voltage power supply 154, can be supplied to the upper electrode. For example, DC power of up to about 20 kW (e.g., corresponding to about 0 to about 20 kV of supply voltage) can be provided. The inventors have found that using DC power at 202 results in forming a narrow ebeam e.g., narrow electron energy distribution.

In at least some embodiments, at 202, in conjunction with the low frequency RF power and/or the DC power, high frequency RF power can also be supplied to the upper electrode using, for example, a high frequency RF power generator, e.g., the high frequency RF power generator 120. As noted above, the high frequency RF power can be used to increase plasma density or ebeam flux.

Next 204, a plasma comprising ions can be generated in the process volume using, for example, the power provided to the upper electrode. For example, the process gas introduced into the process volume can be ignited using the DC power, the low frequency RF power, and/or the high frequency RF power provided to the upper electrode to create the plasma.

Next, at 206, the upper electrode is bombarded with the ions to cause the upper electrode to emit secondary electrons and form an ebeam. More particularly, the low frequency RF power (or the DC power) at the upper electrode is used to produce a high sheath voltage, so that ion bombardment (e.g., using ions formed from the plasma) on the upper electrode is energetic enough to release secondary electrons from the upper electrode. In some embodiments and as noted above with respect to 202, high frequency RF power can also be applied to the upper electrode to increase plasma density or ebeam flux.

At 208, a bias power is supplied to a lower electrode (e.g., the electrode 144). For example, in at least some embodiments, the bias power can be supplied to the lower electrode using an RF bias power generator, e.g., the RF bias power generator 162, that is configured to supply either low frequency RF power or high frequency RF power to the lower electrode for accelerating electrons of the ebeam toward the lower electrode. More particularly, the high sheath voltage at the upper electrode and the relatively low bias potential at the lower electrode accelerates the secondary electrons into the main plasma with enough energy to overcome the substrate sheath potential and reach a substrate surface (e.g., the substrate 111).

In at least some embodiments, one or more gases can be used to enhance heat transfer from the pedestal (and/or the lower electrode) to the substrate. For example, in at least some embodiments, He or other suitable gas for transferring heat can be applied, using, for example, one or more gas supplies (e.g., gas supplies 138), between the pedestal (and/or the lower electrode) and the substrate to enhance heat transfer.

The generated ebeam can be used to etch the substrate to form one or more features on the substrate. For example, in some embodiments, the generated ebeam can be used to form one or more memory holes in the substrate. More particularly, the inventors have found that the ebeam can be used to form memory holes with an etch depth of about 200 nm to about 500 nm, with no ARDE effect, no bowing or twisting of the sidewalls that define the memory hole, and with better CD (e.g., flat bottom) and relatively straight profiles.

The inventors have also found that one or more pulsing schemes (e.g., control of pulsing duty cycle, pulsing synchronization, duty cycle and delay) can be used to control a balance between ebeam flux and ion flux. For example, in the method 200, any supplied RF power can use a pulsing or continuous wave (CW) mode to achieve desired results for different applications (e.g., high or low aspect ratio, logic or memory, etc.). Alternatively or in combination, in the method 200, any supplied DC power can use a pulsing or continuous mode to achieve desired results for different applications (e.g., high or low aspect ratio, logic or memory, etc.). More particularly, to maximize ebeam bombardment dose incident on the substrate, one or more pulsing schemes can be used as described below.

In at least some embodiments, for example, one or both of low frequency RF power or DC power can be continuously provided to the upper electrode (as described above with respect to 202) and low frequency RF power can be provided to the lower electrode (as described above with respect to 208). In some embodiments, the DC power supply voltage provided to the upper electrode is greater than the low frequency RF power supply voltage provided to the lower electrode during at least some portion of the sinusoidal cycle of the low frequency RF power. In addition, in some embodiments, the low frequency RF power supply voltage provided to the lower electrode can be pulsed at a low duty cycle (e.g., about ten percent (10%) to about seventy percent (70%), such as about fifty percent (50%)). The pulse frequency can be from about 50 Hz to about 100 kHz. Using such a pulsing scheme reduces substrate sheath potential (e.g., during the low frequency RF power off time at the lower electrode), thus increasing ebeam bombardment dose at the substrate surface. That is, only ebeam electrons with energy higher than a substrate sheath potential can reach the substrate surface.

In embodiments when low frequency RF power is supplied to the upper electrode, pulsing can be configured such that when power is supplied to the upper electrode, low frequency RF power is not supplied to the lower electrode, and vice versa. Alternatively, the low frequency RF power can be supplied in CW mode to the upper electrode and low frequency RF power can be supplied to the lower electrode in a pulsed low duty cycle, as described above.

In at least some embodiments, both low frequency RF power and DC power can be supplied to the upper electrode and lower electrode in a pulsing mode, but synchronized in such a way that when power is supplied to the upper electrode, power to the lower electrode is off. For example, when one or both of low frequency RF power and DC power is supplied to the upper electrode, low frequency RF power is not supplied to the lower electrode. In such an embodiment, the on/off pulsing cycles can be set at a frequency of about 100 Hz to about 100 kHz. In such an embodiment, alternate ion fluxes and ebeam fluxes are applied to the substrate, thus increasing ebeam bombardment dose at the substrate surface.

While the foregoing is directed to embodiments of the present disclosure, other and further embodiments of the disclosure may be devised without departing from the basic scope thereof.

The invention claimed is:

1. A method for processing a substrate, comprising:
applying at least one of low frequency RF power or DC power to an upper electrode formed from a high secondary electron emission coefficient material disposed adjacent to a process volume;
generating a plasma comprising ions in the process volume;
bombarding the upper electrode with the ions to cause the upper electrode to emit electrons and form an electron beam;
applying a bias power comprising at least one of low frequency RF power or high frequency RF power to a lower electrode disposed in the process volume to accelerate electrons of the electron beam toward the lower electrode; and
applying the at least one of low frequency RF power or DC power in a continuous mode to the upper electrode, and
wherein applying the bias power comprises applying low frequency RF power to the lower electrode in a pulsing mode, such that a given pulse of low frequency RF power provides a voltage to the lower electrode that is less than a voltage applied to the upper electrode during at least some portion of a sinusoidal cycle of the low frequency RF power.

2. The method of claim 1, wherein the high secondary electron emission coefficient material is at least one of silicon (Si), silicon nitride (SiN), silicon oxide (SiOx), or carbon (C).

3. The method of claim 1, wherein generating the plasma comprising the electrons comprises introducing at least one of helium (He), argon (Ar), hydrogen (H2), hydrogen bromide (HBr), ammonia (NH3), disilane (Si2H6), methane (CH4), acetylene (C2H2), nitrogen trifluoride (NF3), tetrafluoromethane (CF4), sulfur hexafluoride (SF6), carbon monoxide (CO), carbonyl sulfide (COS), trifluoromethane (CHF3), hexafluorobutadiene (C4F6), chlorine (Cl2), nitrogen (N2), or oxygen (O2) into the process volume.

4. The method of claim 1, further comprising maintaining the upper electrode from a process position for processing a substrate at a distance of about 2 inches to about 20 inches.

5. The method of claim 1, further comprising maintaining a pressure within the process volume from about 0.1 mTorr to about 300 mTorr.

6. The method of claim 1, further comprising applying high frequency RF power in conjunction with the at least one of low frequency RF power or DC power to the upper electrode.

7. The method of claim 1, further comprising applying the at least one of low frequency RF power or DC power to the upper electrode in a pulse mode, and
wherein applying the bias power comprises applying low frequency RF power to the lower electrode in the pulsing mode, such that when the at least one of low frequency RF power or DC power to the upper electrode is pulsed on, the low frequency RF power to the lower electrode is pulsed off.

8. A nontransitory computer readable storage medium having stored thereon instructions that when executed by a processor configure the processor to perform a method for processing a substrate, comprising:
applying at least one of low frequency RF power or DC power to an upper electrode formed from a high secondary electron emission coefficient material disposed adjacent to a process volume;
generating a plasma comprising ions in the process volume;
bombarding the upper electrode with the ions to cause the upper electrode to emit electrons and form an electron beam;
applying a bias power comprising at least one of low frequency RF power or high frequency RF power to a lower electrode disposed in the process volume to accelerate electrons of the electron beam toward the lower electrode; and
applying the at least one of low frequency RF power or DC power in a continuous mode to the upper electrode, and
wherein applying the bias power comprises applying low frequency RF power to the lower electrode in a pulsing mode, such that a given pulse of low frequency RF power provides a voltage to the lower electrode that is less than a voltage applied to the upper electrode during at least some portion of a sinusoidal cycle of the low frequency RF power.

9. The nontransitory computer readable storage medium of claim 8, wherein the high secondary electron emission coefficient material is at least one of silicon (Si), silicon nitride (SiNi), silicon oxide (SiOx), or carbon (C).

10. The nontransitory computer readable storage medium of claim 8, wherein generating the plasma comprising the electrons comprises introducing at least one of helium (He), argon (Ar), hydrogen (H2), hydrogen bromide (HBr), ammonia (NH3), disilane (Si2H6), methane (CH4), acetylene (C2H2), nitrogen trifluoride (NF3), tetrafluoromethane (CF4), sulfur hexafluoride (SF6), carbon monoxide (CO), carbonyl sulfide (COS), trifluoromethane (CHF3), hexafluorobutadiene (C4F6), chlorine (Cl2), nitrogen (N2), or oxygen (O2) into the process volume.

11. The nontransitory computer readable storage medium of claim 8, further comprising maintaining the upper electrode from a process position for processing a substrate at a distance of about 1 inch to about 20 inches.

* * * * *